United States Patent [19]

Erbe

[11] Patent Number: 4,890,329
[45] Date of Patent: Dec. 26, 1989

[54] HEARING AID COMPRISING PRINTED CIRCUIT BOARD

[75] Inventor: Ehrenfried Erbe, Effeltrich, Fed. Rep. of Germany

[73] Assignee: Siemens Aktiengesellschaft, Berlin and Munich, Fed. Rep. of Germany

[21] Appl. No.: 202,829

[22] Filed: Jun. 6, 1988

[30] Foreign Application Priority Data

Jun. 26, 1987 [DE] Fed. Rep. of Germany ... 8708893[U]

[51] Int. Cl.$^4$ ............................................. H04R 25/00
[52] U.S. Cl. ..................................... 381/68.7; 381/68; 381/69
[58] Field of Search .................. 381/68.7, 68, 69, 69.1, 381/69.2

[56] References Cited

U.S. PATENT DOCUMENTS 4,639,556  1/1987  Hartl et al. ........................ 381/68.6

FOREIGN PATENT DOCUMENTS 08426609  1/1986  Fed. Rep. of Germany .
8328734.5  3/1986  Fed. Rep. of Germany .

OTHER PUBLICATIONS

"Flexible Circuitry, Leadless Components and Vapor Phase Soldering", *Henring Instruments*, Thomas Long Well and Raymond Cozzens, Feb. 1983, pp. 4 & 46.

*Primary Examiner*—Jin F. Ng
*Assistant Examiner*—Danita R. Byrd
*Attorney, Agent, or Firm*—Hill, Van Santen, Steadman & Simpson

[57] ABSTRACT

A hearing aid has a printed circuit board arranged in a hearing aid housing. The printed circuit board has a flexible extension arm and wings which hold hearing aid components in an especially spaec-saving fashion. The extension arm holds soldered-on actuators and is folded around and holds a hearing coil arrangement. A further space-saving results form this design since the hearing coil arrangement intercepts actuation stresses of actuators and, as a result thereof, the need for a further, rigid foundation becomes superfluous.

14 Claims, 1 Drawing Sheet

HEARING AID COMPRISING PRINTED CIRCUIT BOARD

RELATED APPLICATIONS

This application is related to copending applications of the same inventor entitled "HEARING AID COMPRISING A PRINTED CIRCUIT FILM", Ser. No. 202,828 filed June 6, 1988; and "HEARING AID COMPRISING PRINTED CIRCUIT BOARD AND LISTENING COIL", Ser. No. 202,961 filed June 6, 1988.

BACKGROUND OF THE INVENTION

The present invention is directed to a hearing aid wherein a printed circuit board having hearing aid components mounted thereon is arranged interiorly within a hearing aid housing.

It has proven advantageous for accommodating in space saving fashion printed circuit boards, and particularly printed circuit films, in a hearing aid housing be designing the printed circuit board with extension arms that can better fill remaining cavities in the hearing aid. Such a printed circuit on a flexible film and having an extension arm is disclosed, for example, by German Utility Model No. 83 28 734 (also see U.S. Pat. No. 4,639,556 and European Patent No. A 0 136 643), all incorporated herein. This reference discloses a film that is designed for an in-the-ear hearing aid. The extension arm thereof encompasses a bending zone free of components and a distal surface equipped with components on one side.

A further possibility of using extension arms may be derived from German Utility Model 84 26 609, incorporated herein. The extension arm disclosed in this publication, which distally projects from the actual film, is bent by 90° and has its distal ends secured to conductive wings that are likewise bent by 90° with reference to the film in order to stabilize the printed circuit film. At its outwardly directed surface, moreover, the extension arm holds a switch-over means. Other possibilities of using such extension arms, however, are not disclosed.

SUMMARY OF THE INVENTION

An object of the present invention is to utilize a printed circuit board having a flexible extension arm in a hearing aid such that an even greater space-saving incorporation of hearing aid components results.

This object is achieved according to the invention by providing a flexible extension arm which is connected to a base part of the printed circuit board and wherein the extension arm means at least partially folds over hearing aid components within the housing and to overlie and be positioned adjacent the base part of the printed circuit board.

With the invention the previously unused second (lower) surface of the extension arm is utilized for holding hearing aid components. The holding of these hearing aid components occurs by the extension arm itself that is folded around the components and thus firmly encompasses them.

In an advantageous development, the extension arm is locked with a hook-eyelet connection for further securing of the hearing aid components that are folded over. The opposite surface of the extension arm continues to be used for holding additional components, whereby the hearing aid components held under the extension arm serve as a firm foundation for the additional components.

DESCRIPTION OF THE PREFERRED EMBODIMENTS

Figure 1:
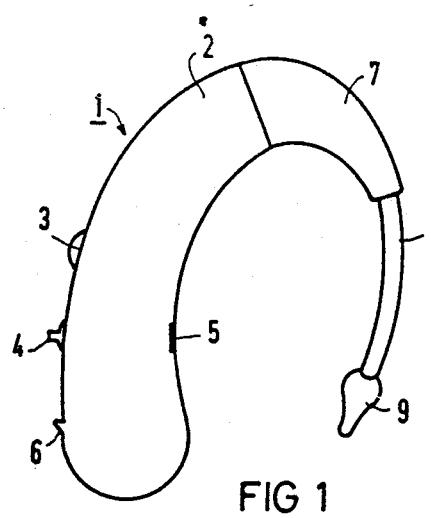
FIG. 1 is an outside view of a hearing aid according to the invention which is worn behind the ear.

FIG. 1 shows a hearing aid 1 to be worn behind the ear. The housing 2 thereof contains electrical as well as electro-mechanical elements for processing acoustical signals. This processing can be influenced by a number of operating elements accessible from the outside, for example volume control 3, on/off switch 4 and (not visible) actuator arrangement 5. The hearing aid 1 also comprises a battery compartment 6 and a carrying hook 7 at the opposite end. The processed acoustical signals are supplied to the ear via a hose 8 secured to the carrying hook 7 and via an ear adapter member 9 adapted to the auditory canal of the hearing-impaired person.

Figure 2:
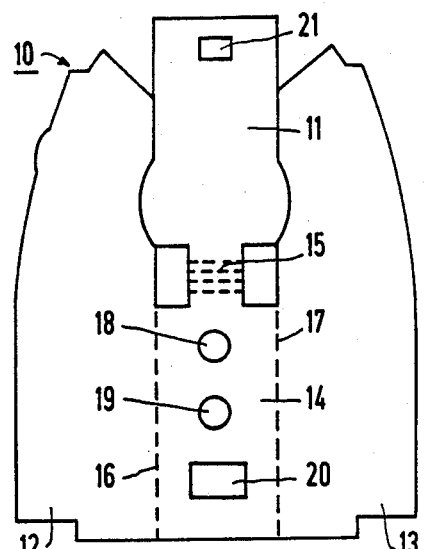
FIG. 2 is a plan view of a printed circuit board employed in the invention.

FIG. 2 shows a flexible printed circuit film or board 10 comprising an extension arm 11. The extension arm 11 as well as the two printed circuit wings 12, 13 are provided with electrical terminals for hearing aid components. A base part 14 is fashioned as an electrical and mechanical connection between extension arm 11 and printed circuit wings 12, 13. The flexible printed circuit film or board 10 comprises three bending zones 15, 16, 17. Bending zone 15 defines the boundary region between base part 14 and extension arm 11. Individual bending zones 16 and 17 respectively lie between the base part 14 and one of the two printed circuit wings 12, 13. Two button holes 18, 19 and an opening 20 are provided for mounting the printed circuit film 10 in the hearing aid housing 2 by means of a carrier 24. An eyelet 21 is also situated at the extension arm, and is used according to the invention for holding the folded-back extension arm upon inclusion of a hearing aid component to be mounted, for example a hearing coil arrangement.

Figure 3:
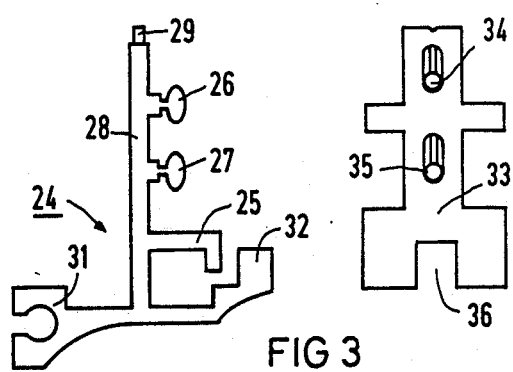
FIG. 3 is a side view of a mounting part and a plan view of a further mounting part for holding the printed circuit board on FIG. 2.

After the printed circuit film 10 on the extension arm 11 and the printed circuit wings 12, 13 have been equipped with hearing aid components 22, 23, it is buttoned to a carrier 24 shown in FIG. 3. As a retention system, the hook 25 is thus threaded through the printed circuit film opening 20, and the buttons 26, 27 are then pressed through the button holes 18, 19. Hook 25, as well as buttons 26, 27 are arranged on a web part 28 that has the width of the base part 14 of the printed circuit film. The distal end 29 of the web part 28 is fashioned such that it can support itself against the inside of the housing shell 2. Further support parts of the carrier 24 are referenced 31 and 32.

An interlock part 33 is used for securing the plugged-on printed circuit film 10. This interlock part 33 likewise comprises button holes 34, 35 and recess 36 for the hook 25.

In order to make the printed circuit film 10 ready for integration into the housing 2, the printed circuit wings 12, 13 are each bent by 90° in the direction of the supporting part 31. Since the base part 14 of the printed circuit film 10 has its underside lying flat on the web part 28, the web part 28 facilitates the bending at the edges (assures that the printed circuit film 10 is bent only along the bending zones 16, 17).

Subsequently, a hearing coil arrangement 37 is put in place on the interlocked part 33 in frame-like fashion. The hearing coils 38, 39 have their rounded portions lying directly over the bending zones 16, 17 of the printed circuit film on which no hearing aid components are arranged. They thus adapt well and in a space-saving fashion into the roundings of the bending zones of the printed circuit film. The hearing coil arrangement 37 is secured by the extension arm 11 which is folded over the hearing coil arrangement 37 and is hooked to the hook 25 with the eyelet 21 located at the end of the extension arm 11. Here, the hearing coil arrangement 37 again facilitates the proper bending of the bending zone 15.

Figure 4:
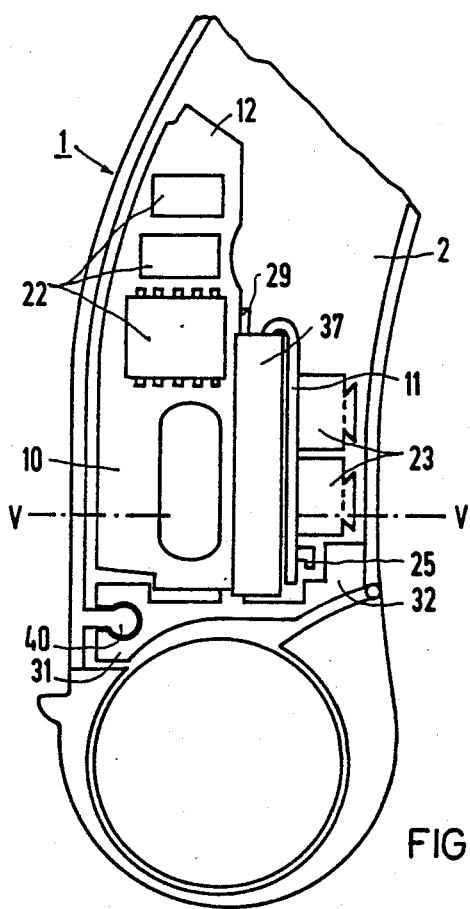
FIG. 4 is a side view of the printed circuit board of FIG. 2 equipped with components, inserted into the hearing aid housing, and having a folded extension arm according to the invention.

The carrier 24, together with printed circuit film 10, can then be integrated into the hearing aid housing 2, as shown in FIG. 4. Support part 31 secures carrier 24 in the housing 2 by receiving in plugging fashion the cross rod 40 attached to housing 2. Actuator 23 at that surface of the extension arm 11 facing away from the hearing coil arrangement 37 is supported against the opposite side of the housing shell 2. Although the actuators 23 are seated on the thin, flexible extension arm 11, they are secured against actuation stresses since the hearing coil arrangement 37, the interlock part 33, and the web part 28 form a firm foundation.

Figure 5:
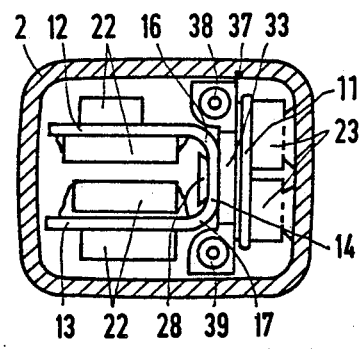
FIG. 5 is a printed circuit board arrangement shown in cross-section V—V of FIG. 4.

FIG. 5 shows a cross section through the hearing aid 1 according to the section curve V—V in FIG. 4. The especially space-saving arrangement of hearing aid components may be clearly seen therefrom.

Although various minor changes and modifications might be proposed by those skilled in the art, it will be understood that I wish to include within the claims of the present warranted hereon all such changes and modifications as reasonably come within my contribution to the art.

I claim as my invention:

1. A hearing aid, comprising:
a housing having a printed circuit board arranged interiorly thereof; and
said printed circuit board having a base part with at least one hearing aid component positioned thereat, a flexible extension arm means connected to the base part for at least partially folding over said at least one hearing aid component positioned at the base part, and wherein said extension arm means overlies and is positioned adjacent and substantially parallel to said base part of the circuit board when folded over such that at least one hearing aid component is mechanically held in position between and by substantially parallel facing surfaces of the extension arm means and the base part.

2. A hearing aid according to claim 1 wherein said hearing aid component is connected to the base part by an interlocked part, said interlocked part being connected to the base part.

3. A hearing aid according to claim 1 wherein said hearing aid component which the flexible extension arm means at least partially folds over is connected to the printed circuit board by a carrier and associated interlocking means, said carrier having a retention means for retaining the flexible extension arm means in the folded over position.

4. A hearing aid according to claim 3 wherein the retention means comprises a hook engageable in a corresponding eyelet at an end of the flexible extension arm means.

5. A hearing aid according to claim 1 wherein the flexible extension arm means is folded over by approximately 180°.

6. A hearing aid according to claim 1 wherein the hearing aid component which is at least partially folded over by the extension arm means comprises a hearing coil arrangement.

7. A hearing aid according to claim 1 wherein a further hearing aid components are connected to the extension arm means on a side thereof facing away from the hearing aid component which is at least partially folded over by the extension arm means.

8. A hearing aid according to claim 7 wherein said further hearing aid components comprise actuators.

9. A hearing aid according to claim 1 wherein the printed circuit board comprises at least one printed circuit wing bent over by approximately 90° with respect to said base part, and said flexible extension arm means being bent over such that it is adjacent the surface of the base part which faces away from the side of the base part which faces said at least one printed circuit wing.

10. A hearing aid according to claim 9 wherein said extension arm means is integral with and flexibly hinged by an integral hinge portion at a bending zone with the base part.

11. A hearing aid, comprising:
a housing having a printed circuit board arranged interiorly thereof;
said printed circuit board having a base part with at least one hearing aid component connected thereto, and a flexible extension arm means connected to the base part for at least partially folding over said at least one hearing aid component connected to the base part, and wherein said extension arm means overlies and is positioned adjacent said base part of the circuit board and said at least one hearing aid component when folded over; and
said hearing aid component being connected to the base part by an interlocked part, said interlocked part being connected to the base part.

12. A hearing aid, comprising:
a housing having a printed circuit board arranged interiorly thereof;
said printed circuit board having a base part with at least a first hearing aid component attached thereto, a flexible extension arm means connected to the base part for at least partially folding over said at least first hearing aid component, and wherein said flexible extension arm means overlies and is positioned over a first surface of the printed circuit board;
first and second wings extending from said base part and wherein bending edges of the wing means are at right angles to a bending edge of the extension arm means, said flexible wings being bent at approximately 90° angle with respect to said base part;

at least a second hearing aid component attached to the wings and at least a third hearing aid component is attached to a surface of the extension arm means facing away from the base part, and wherein means are provided for attaching the first hearing aid component to the base part; and said means for attaching the first hearing aid component comprising a carrier having an associated interlocking part, and wherein the extension arm means comprises retention means for holding the extension arm means in a 180° fold-over locked position.

13. A hearing aid, comprising:

a housing having a carrier and a printed circuit board arranged interiorly thereof;

said printed circuit board having a base part with at least one hearing aid component positioned thereon, and a flexible extension arm means connected to the base part for at least partially folding over and mechanically retaining said at least one hearing aid component positioned on the base part, and wherein said extension arm means at least partially overlies and is positioned adjacent said base part of the circuit board when folded over, and said extension arm means being retained in folded over position by a retention means of the carrier.

14. A hearing aid, comprising:

a housing having a printed circuit board arranged therein;

the printed circuit board comprising a flexible extension arm that is hingedly connected to a base part of the printed circuit board at a hinge location; and the extension arm being bent such that at least one hearing aid component is mechanically held between facing surfaces of the extension arm and of the base part of the printed circuit board in the bent position of the extension arm;

wherein the base part is secured to a carrier mounted in the housing, and the extension arm is held in its bent position by fastening means associated with the carrier.

* * * * *